United States Patent
Kang

[19]

[11] Patent Number: 6,134,177
[45] Date of Patent: Oct. 17, 2000

[54] REDUNDANCY DECODING CIRCUIT HAVING AUTOMATIC DESELECTION

[75] Inventor: Tae-Kyun Kang, Kyunggi-do, Rep. of Korea

[73] Assignee: Samsung Electronics, Co., Ltd., Suwon, Rep. of Korea

[21] Appl. No.: 09/366,433

[22] Filed: Aug. 2, 1999

[30] Foreign Application Priority Data

Aug. 1, 1998 [KR] Rep. of Korea ............ 98-31423

[51] Int. Cl.⁷ ................................ G11C 7/00
[52] U.S. Cl. ............. 365/230.06; 365/194; 365/200
[58] Field of Search ................ 365/230.06, 200, 365/194

[56] References Cited

U.S. PATENT DOCUMENTS 5,146,429  9/1992  Kawai et al. .................. 200/365
5,471,426  11/1995  McClure ....................... 200/365

OTHER PUBLICATIONS

Samsung Electronics Document, "64K×36 Synchronous SRAM", May 1999, pp. 1–15.

*Primary Examiner*—Vu A. Le
*Attorney, Agent, or Firm*—Marger Johnson & McCollom, P.C.

[57] ABSTRACT

A redundancy decoding circuit reduces standby power consumption in a memory device by automatically deactivating a deselect signal after a burst read/write operation, thereby eliminating a current path through the redundancy decoding circuit. The redundancy decoding circuit includes a pulse generator which generates a pulse signal having a predetermined pulse width that is just long enough to accommodate a read/write operation. The pulse signal is applied as the deselect signal to a drive circuit which provides drive current to a comparator for decoding a redundant address. A pulse begins when the chip select signal is activated and ends after a predetermined time. The pulse generator is implemented as plurality of series-connected flip-flops and a logic circuit for combining the outputs from the flip-flops which are clocked by a common clock signal.

11 Claims, 7 Drawing Sheets

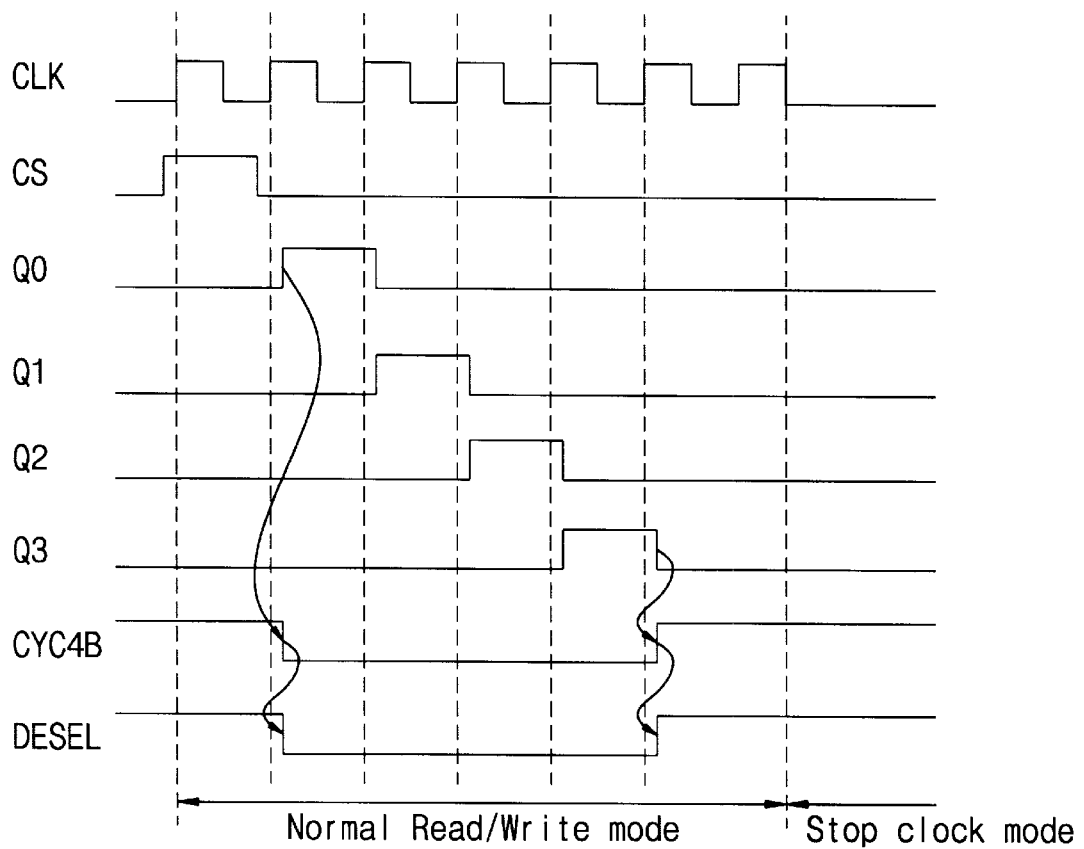

REDUNDANCY DECODING CIRCUIT HAVING AUTOMATIC DESELECTION

This application claims priority from Korean patent application No. 98-31423 filed Aug. 1, 1998 in the name of Samsung Electronics Co., Ltd., which is herein incorporated by reference.

BACKGROUND OF THE INVENTION

1. Field of the Invention

The present invention relates to memory devices, and more particularly, to a redundancy decoding circuit having an automatic deselection feature for reducing power consumption in a semiconductor memory device.

2. Description of the Related Art

As the integration density of VLSI memory devices increases, the probability of encountering a defective memory cell also increases. To prevent a reduction in the yield rate due to defective cells, redundancy schemes are used to replace defective memory cells in devices having a limited number of defective cells. Examples of redundancy schemes can be found in U.S. Pat. Nos. 5,471,426 and 5,146,429.

FIG. 1 is a circuit diagram of a conventional redundancy decoding circuit 100 which is used to decode redundancy cells that are used in place of defective cells in a memory device. The redundancy decoding circuit 100 of FIG. 1 includes a comparator 10, which includes internal fuses F1–F4, N-channel metal-oxide semiconductor (NMOS) transistors MN1–MN4, and inverters INV1 and INV2. Comparator 10 decodes a redundant address which is applied through input terminals A1B and A2B responsive to the status of internal fuses F1–F4, thereby generating a redundancy activation status signal (REDB) at output terminal N1.

The redundancy decoding circuit 100 of FIG. 1 also includes a drive circuit which includes two P-channel metal-oxide semiconductor (PMOS) transistors MP1 and MP2, and an NMOS transistor MN5. The drive circuit supplies the drive current to the output terminal N1 of comparator 10. A deselect signal DESEL, which is received from a latch L2 from inverters INV4 and INV5, is applied to the gates of transistor MP2 and MN5.

The redundancy decoding circuit 100 of FIG. 1 further includes a switching control signal generator which includes a master fuse MF and a high impedance resistor R1 connected in series with MF between a power supply voltage VCC and a ground voltage VSS. Resistor R1 is fabricated from a polysilicon material. The switching control signal generator generates a switching control signal which is applied to gate of transistor MP1, thereby allowing the drive circuit to drive the comparator 10.

The master fuse MF, along with appropriate ones of the internal fuses F1–F4, can be cut using a laser beam or high voltage while the semiconductor memory device is still in the wafer state. To enable the redundancy decoding circuit 100 of FIG. 1 to decode a redundant cell instead of a defective memory cell, master fuse MF must be cut, thereby allowing resistor R1 to pull the gate of MP1 down to the low logic level. This allows the drive circuit to supply a drive current from the power supply voltage VCC to the output terminal N1 when the deselect signal DESEL is pulled low. The comparator 10 then decodes an address applied through the redundant address input terminals A1B and A2B, thereby generating a redundancy activation status signal REDB at output terminal N1 for decoding a redundant memory cell depending upon which of the internal fuses F1–F4 are cut.

To reduce standby current during standby mode in a semiconductor memory device used in a battery-powered electronics system, the frequency of a clock signal can be reduced to zero (i.e., the clock signal does not transition). An example of a synchronous burst static random access memory (SRAM) in which the clock signal can be stopped is disclosed in Samsung specification "KM736V687" for a 64K×36 synchronous SRAM, revision 1.0, May 1997, which is hereby incorporated by reference. Hereinafter, when the clock frequency is zero, the standby mode will be referred to as "stop mode" or "stop clock mode". A problem with the conventional redundancy decoding circuit 100 described above is that a DC current path can exist during stop mode as will be described more fully below with reference to FIG. 2A which is a timing diagram illustrating signals at various points in FIG. 1 when the decoding circuit transitions from a deselect mode to a stop mode, and FIG. 2B, which is a timing diagram illustrating the signals when the circuit of FIG. 1 transitions from a normal read/write mode to stop mode.

Referring to FIG. 2A, when the semiconductor memory device is deselected, that is, the chip select signal CSB switches from low to high, the signal CSB is transferred to latch L2 through transmission gates TG1 and TG2 which are controlled by control signals BI and BIB. Latch L2 outputs the deselect signal DESEL at a high logic level, which turns transistor MP2 off. Under these conditions, when a semiconductor memory device having the decoding circuit of FIG. 1 enters stop mode, there is no DC current path through the redundancy decoding circuit even though master fuse MF is open.

However, if the semiconductor memory device enters stop mode after a normal read/write operation as shown in FIG. 2B, the chip select signal CSB is latched at a low level into latch L2 by control signals BI and BIB, thereby driving the deselect signal DESEL low. A normal read/write operation is performed in a manner known in the art, after which the device enters stop mode. Under these conditions, namely, the master fuse MF is disconnected, and the deselect signal DESEL is at a low level, a DC current path including transistors MP1, MP2, and any of fuses F1–F4 which are not cut, exists in the decoding circuit 100 of FIG. 1 during stop mode. This causes standby current to increase during stop mode.

SUMMARY OF THE INVENTION

A redundancy decoding circuit in accordance with the present invention reduces standby power consumption in a memory device by automatically deactivating a deselect signal after a burst read/write operation, thereby eliminating a current path through the redundancy decoding circuit. The redundancy decoding circuit includes a pulse generator which generates a pulse signal having a predetermined pulse width that is just long enough to accommodate a read/write operation. The pulse signal is applied as the deselect signal to a drive circuit which provides drive current to a comparator which decodes a redundant address. A pulse begins when the chip select signal is activated and ends after a predetermined time. The pulse generator can be implemented as plurality of series-connected flip-flops and a logic circuit for combining the outputs from the flip-flops which are clocked by a common clock signal.

One aspect of the present invention is a redundancy decoding circuit comprising a comparator, a driving circuit, a switching control signal generator and a pulse generator. The comparator decodes and outputs a redundant address and has internal fuses coupled to an output terminal thereof, wherein the internal fuses are configured to be selectively cut in order to determine the redundant address. The driving circuit supplies a driving current to the output terminal of the comparator in response to a switching control signal and a pulse signal, and the switching control signal generator generates the switching control signal. The pulse generator generates the pulse signal in response to the activation of a chip select signal, wherein the pulse signal has a pulse width corresponding to a normal read/write operation of the memory device.

Another aspect of the present invention is a method for operating a redundancy decoding circuit having a comparator for decoding a redundant address, a driving circuit for supplying a drive current to the comparator in response to a switching control signal and a deselect signal, and a switching control signal generator for generating the switching control signal, the method comprising: generating a pulse signal having a predetermined pulse width responsive to a chip select signal; and applying the pulse signal to the drive circuit as the deselect signal.

BRIEF DESCRIPTION OF THE DRAWINGS

The present invention will be described by way of exemplary embodiments, but not limitations, illustrated in the accompanying drawings in which like references denote similar elements, and in which:

FIG. 7 is a timing diagram showing control signals used in a redundancy decoding circuit having a pulse generator as illustrated in FIG. 6.

DETAILED DESCRIPTION

Figure 3:
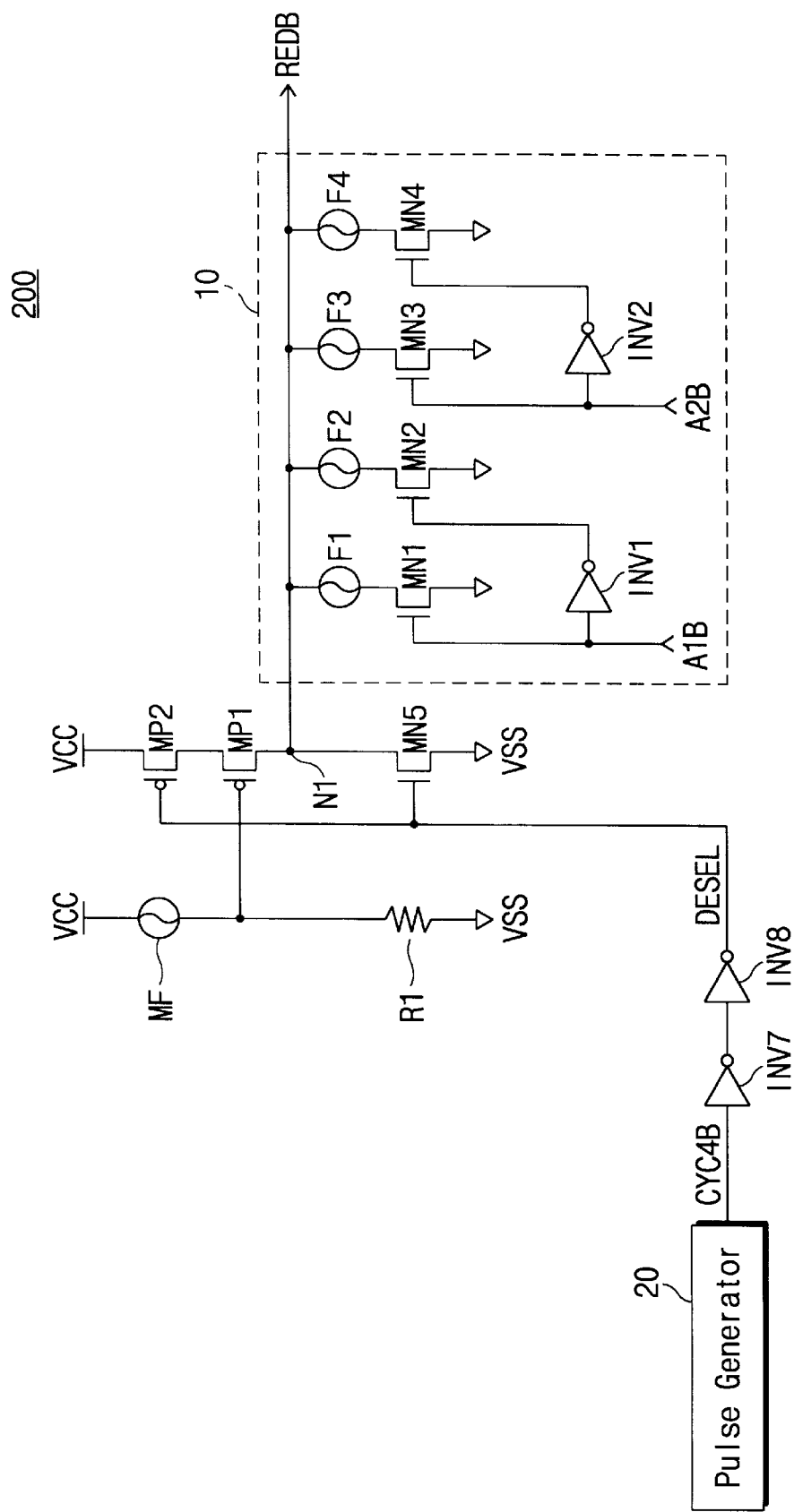
FIG. 3 illustrates an embodiment of a redundancy decoding circuit 200 according to the present invention.

FIG. 3 is a schematic diagram of an embodiment of a redundancy decoding circuit 200 according to the present invention. In FIG. 3, elements which are identical to those of FIG. 1 are labeled with the same reference numerals and description thereof is omitted.

Figure 1:
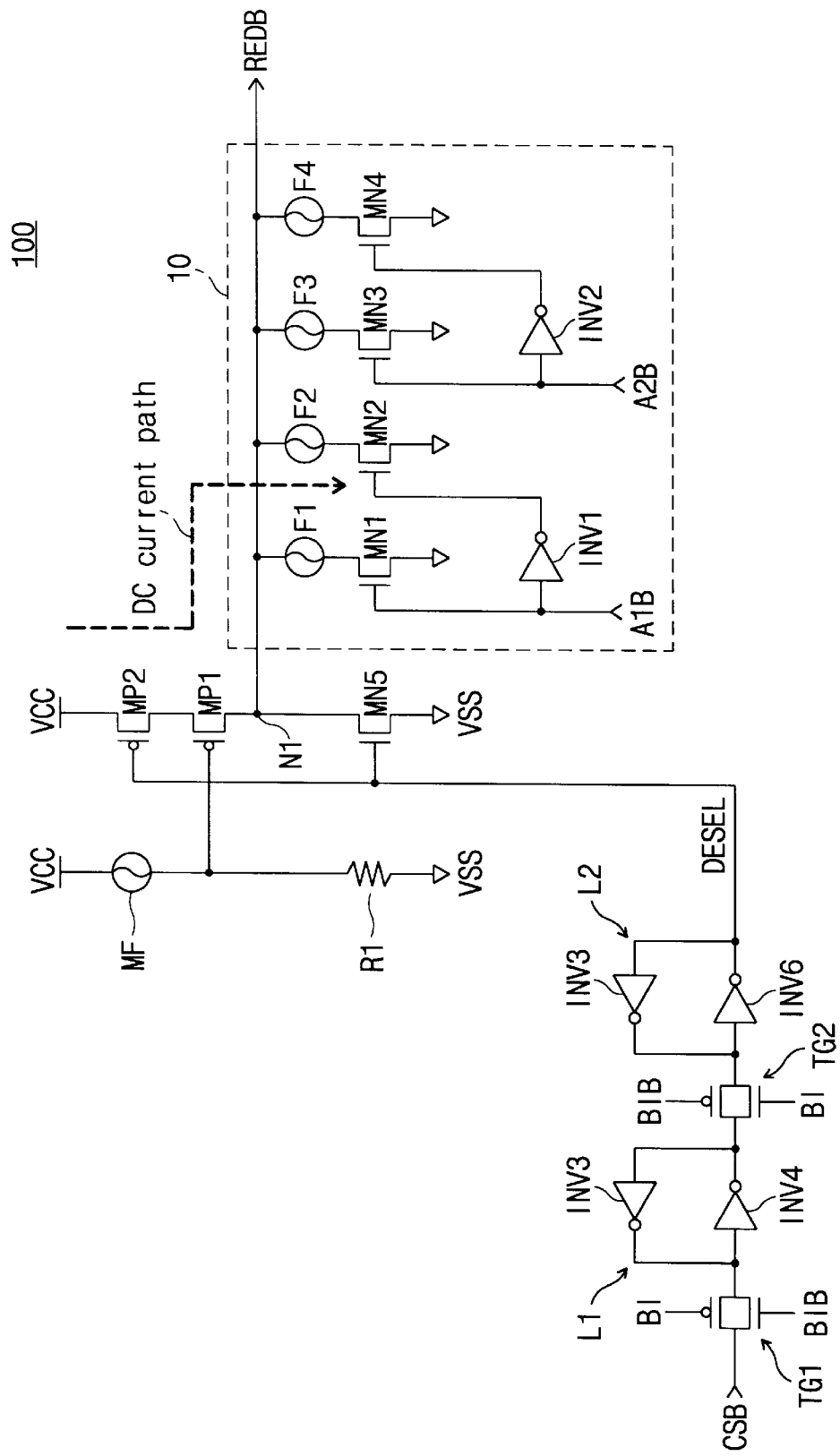
FIG. 1 shows a circuit diagram of a conventional redundancy decoding circuit.
Figure 2A:
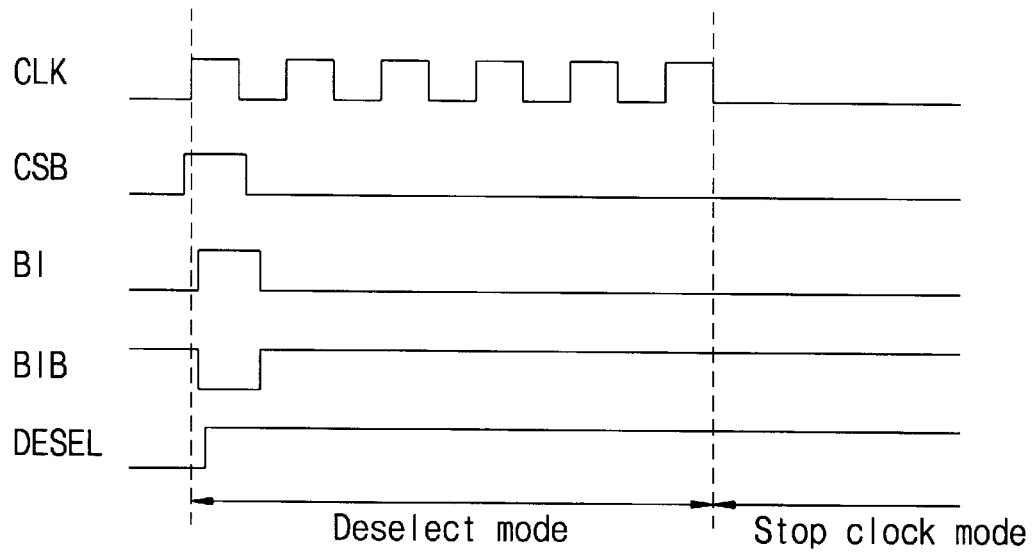
FIG. 2A is a timing diagram showing control signals used in FIG. 1 at the transition from a deselect mode to a stop mode.
Figure 2B:
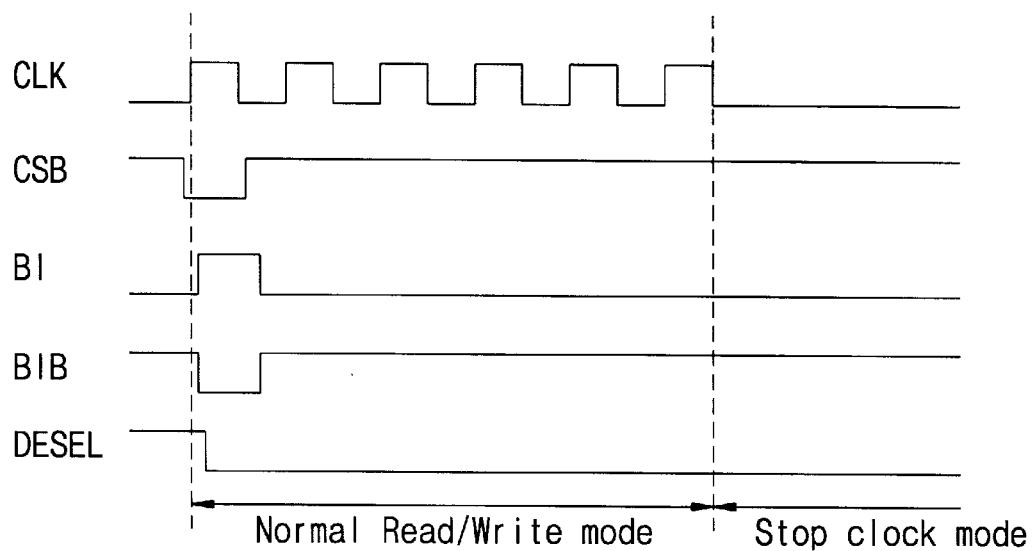
FIG. 2B is a timing diagram showing control signals used in FIG. 1 at the transition from a normal read/write mode to a stop mode.

The redundancy decoding circuit 200 shown in FIG. 3 differs from the conventional circuit 100 of FIG. 1 and that a pulse generator 20 is provided for generating a pulse signal CYC4B which has a pre-determined pulse width. The pulse signal CYC4B goes low when a normal read/write operation begins, and then automatically returns to the high logic level when the normal read/write operation ends. That is, the pulse signal CYC4B is activated to the low state only while a normal read/write operation is performed and is automatically deactivated after a predetermined period of time that is long enough for a normal read/write operation. The pulse signal CYC4B remains deactivated during any period except while a normal read/write operation is being performed, for example, the pulse signal remains deactivated when the semiconductor memory device having the redundancy decoding circuit 200 of FIG. 3 enters stop mode. Therefore, the circuit of FIG. 3 assures that there is no DC current path in stop mode thereby reducing standby current as will be described more fully below.

Figure 4:
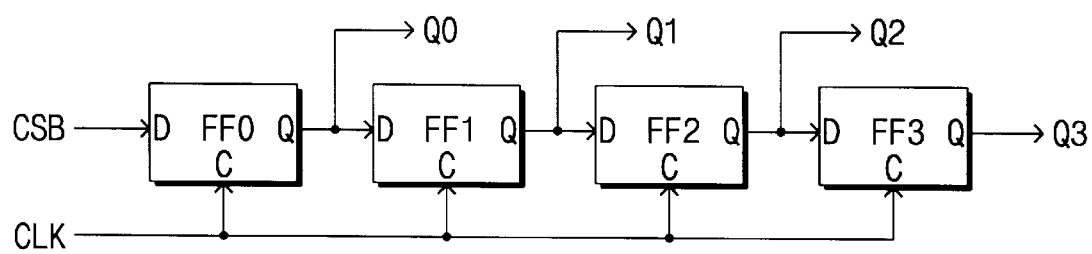
FIG. 4 illustrates an embodiment of the pulse generator 20 illustrated in FIG. 3 according to the present invention.
Figure 4:
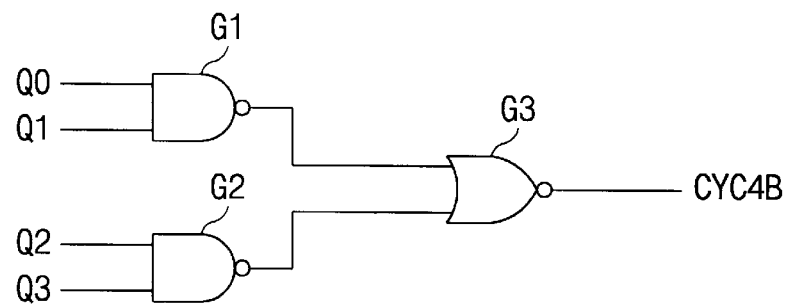

FIG. 4 illustrates an embodiment of the pulse generator 20 illustrated in FIG. 3 in accordance with the present invention. The embodiment of the pulse generator 20 illustrated in FIG. 3 includes four flip-flops FF0–FF3, two 2-input NAND gates G1 and G2, and a 2-input NOR gate G3. Flip-flops FF0–FF3 are D-type flip-flops connected in series with the output Q of each flip-flop connected to the input D of the next flip-flop. The clock inputs C of all four flip-flops are commonly connected and driven by the clock signal CLK. The flip-flops generate a series of output signals Q0–Q3 which are combined by the logic gates G1–G3 which generates the pulse signal CYC4B which has a pulse width corresponding to four cycles of the clock signal CLK.

The redundancy decoding circuit 200 can be integrated into the synchronous burst SRAM disclosed in the specification KM736V687 which supports a four address burst read/write operation. In such an implementation, after the chip select signal CSB is driven low, the pulse signal CYC4B is activated for a period of time which corresponds to the burst cycle of the SRAM because a normal read/write operation is performed during four cycles of the clock signal CLK. However, it will be apparent to one skilled in the art that the redundancy decoding circuit in accordance with the present invention described above is not limited to a four address burst read/write cycle.

Figure 5:
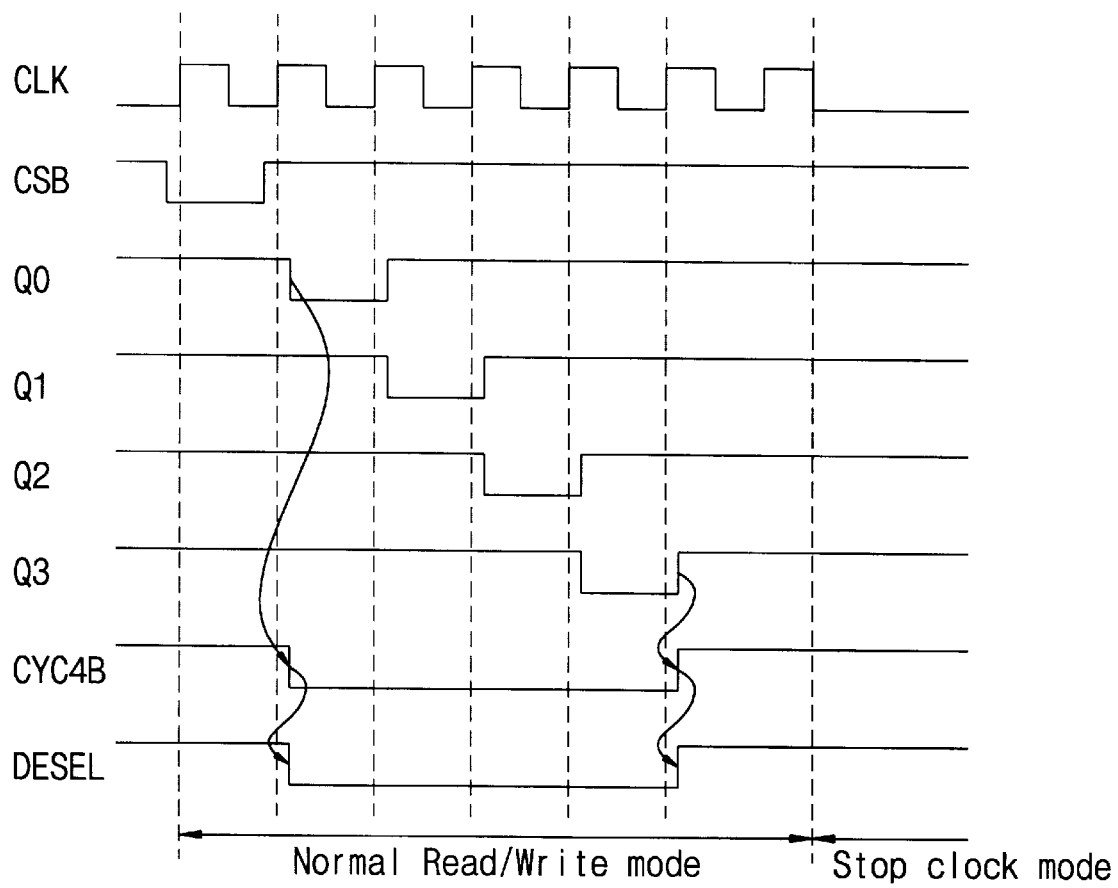
FIG. 5 is a timing diagram showing control signals used in a redundancy decoding circuit having a pulse generator as illustrated in FIG. 4.

FIG. 5 is a timing diagram showing the relationship between various signals in the redundancy decoding circuit 200 shown in FIGS. 3 and 4. The master fuse MF and select ones of the internal fuses F1–F4 must be cut to enable the redundancy decoding circuit to enable a redundant cell in place of a defective memory cell. By cutting the master fuse MF, the gate of PMOS transistor MP1 is pulled low, thereby causing MP1 to turn on. When the chip select signal CSB transitions from high to low as shown in FIG. 5, it is latched in flip-flop FF0 at the rising edge of clock signal CLK and thus, the pulse signal CYC4B is activated (driven low). The pulse signal CYC4B is applied as the deselect signal DESEL to the gates of transistors MP2 and MN5 through series connected inverters INV7 and INV8, thereby causing transistor MP2 to turn on and transistor MN5 to turn off. A drive current is then supplied to the output terminal N1 via transistors MP1 and MP2.

Subsequently, the comparator 10 decodes the address applied through the redundant address input terminals A1B and A2B and generates a redundancy activation status signal REDB at output terminal M1. After a four address burst read/write operation is performed, the pulse signal CYC4B is automatically deactivated to the high state by the pulse generator 20 so that transistor MP2 turns off. Therefore, drive current is no longer supplied to the output terminal M1.

The semiconductor device then enters stop mode as illustrated in FIG. 5. In the conventional circuit illustrated in FIG. 1, a DC current would flow through transistors MP1 and MP2 during stop mode. However, with the circuit of FIG. 3, the DC current flowing from the power supply VCC to the output terminal N1 is blocked because the pulse signal CYC4B returns to the high level after the burst read/write operation, thereby turning off transistor MP2. Therefore, a redundancy decoding circuit in accordance with the present invention reduces standby current consumption during stop mode. Furthermore, the present invention also reduces current consumption during the portion of the read/write mode during which the burst read/write operation is not performed.

Figure 6:
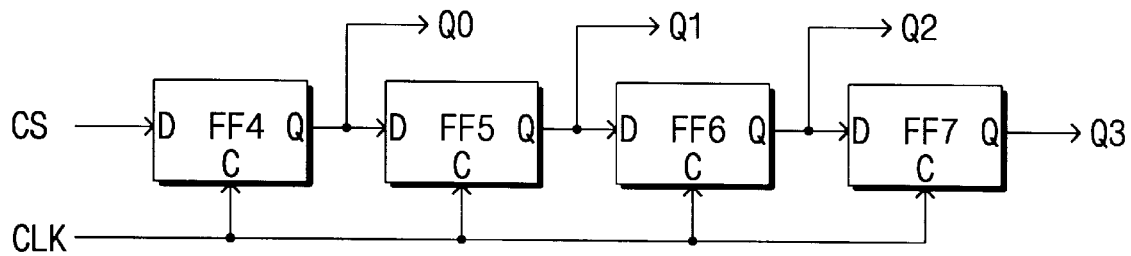
FIG. 6 illustrates another embodiment of a pulse generator illustrated in FIG. 3 according to the present invention.
Figure 6:
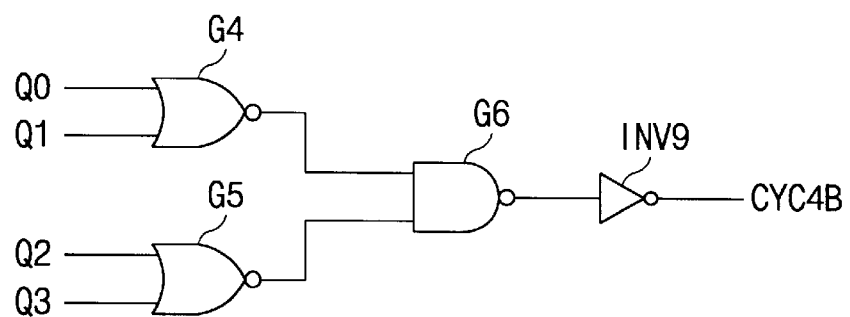

FIG. 6 illustrates an alternative embodiment of the pulse generator 20 in accordance with the present invention. FIG. 7 is a timing diagram illustrating the signals used in the pulse generator illustrated in FIG. 6.

The pulse generator of FIG. 6 differs from that of FIG. 4 in that the chip select signal is active in the high state rather than the low state. Therefore, NAND gates G1 and G2 and NOR gate G3 from FIG. 4 are replaced with NOR gates G4 and G5 and NAND gate G6, respectively, and an inverter INV9 is added to the output of G6. A redundancy decoding circuit 200 using the pulse generator 20 shown in FIG. 6 performs essentially the same function as one having the pulse generator illustrated in FIG. 4, and therefor a further description is omitted.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A redundancy decoding circuit for use in a semiconductor memory device comprising:

a comparator for decoding a redundant address and outputting a status signal, wherein the comparator includes internal fuses coupled to an output terminal thereof; and wherein the internal fuses are configured to be selectively cut in order to determine the redundant address;

a drive circuit coupled to the comparator for supplying a drive current to the output terminal of the comparator in response to a switching control signal and a pulse signal;

a switching control signal generator coupled to the drive circuit for generating the switching control signal, wherein the switching control signal generator includes a master fuse, and wherein a logic level of the switching control signal is determined in accordance with a state of the master fuse; and a pulse generator coupled to the drive circuit for generating the pulse signal in response to a chip select signal, wherein the pulse signal has a width corresponding to a normal read/write operation period of the memory device.

2. The redundancy decoding circuit according to claim 1, wherein the pulse generator comprises:

a plurality of flip-flops connected in series; and a decoding circuit coupled to the flip flops for decoding outputs from the flip-flops to generate the pulse signal;

wherein a first one of the flip-flops receives the chip select signal; and wherein the flip-flops operate in synchronization with a clock signal.

3. The redundancy decoding circuit according to claim 1, wherein the semiconductor memory device supports a four address burst sequence, and wherein the pulse generator comprises:

first through fourth flip-flops, each flip-flop having a data input, a clock input and a data output, wherein the data input of the first flip-flop is coupled to receive the chip select signal;

a first NAND gate having two input terminals coupled to the data outputs of the first and second flip-flops and an output terminal;

a second NAND gate having two input terminals coupled to the data outputs of the third and fourth flip-flops and an output terminal; and a NOR gate having two input terminals coupled to the output terminals of the first and second NAND gates and an output terminal for outputting the pulse signal.

4. The redundancy decoding circuit according to claim 1, wherein the semiconductor memory device supports a four address burst sequence, and wherein the pulse generator comprises:

first through fourth flip-flops, each flip-flop having a data input, a clock input and a data output, wherein the data input of the first flip-flop is coupled to receive the chip select signal;

a first NOR gate having two input terminals coupled to the data outputs of the first and second flip-flops and an output terminal;

a second NOR gate having two input terminals coupled to the data outputs of the third and fourth flip-flops and an output terminal;

a NAND gate having two input terminals coupled to the output terminals of the first and second NOR gates and an output terminal; and an invertor having an input terminal coupled to the output terminal of the NAND gate and an output terminal for outputting the pulse signal.

5. A method for operating a redundancy decoding circuit having a comparator for decoding a redundant address, a driving circuit for supplying a drive current to the comparator in response to a switching control signal and a deselect signal, and a switching control signal generator for generating the switching control signal, the method comprising:

generating a pulse signal having a predetermined pulse width responsive to a chip select signal; and applying the pulse signal to the drive circuit as the deselect signal.

6. A method according to claim 5 wherein the predetermined pulse width corresponds to a read/write period of a memory device for which the redundancy decoding circuit is used.

7. A method according to claim 6 wherein generating the pulse signal includes:

driving a plurality of series-connected flip-flops with the chip select signal; and clocking the flip-flops with a common clock signal.

8. A redundancy decoding circuit for a memory device comprising:

comparator means for decoding a redundant address and generating a status signal;

drive means for supplying a drive current to the comparator means responsive to a pulse signal; and pulse generator means for generating the pulse signal responsive to a chip select signal.

9. A redundancy decoding circuit according to claim 8 wherein the pulse generator means is constructed and adapted to begin a pulse in the pulse signal when the chip select signal is activated and automatically end the pulse after a read/write operation is completed.

10. A redundancy decoding circuit according to claim 8 wherein the drive means supplies the drive current responsive to a switching control signal, and further including signal generator means for generating a switching control signal responsive to the state of a master fuse.

11. A redundancy decoding circuit according to claim 8 wherein the pulse generator means includes:

means for generating a plurality output signals; and logic means for generating the pulse signal responsive to the output signals.

* * * * *